(12) United States Patent
Song et al.

(10) Patent No.: US 10,497,759 B2
(45) Date of Patent: Dec. 3, 2019

(54) OLED DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN); Fengjuan Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/008,493

(22) Filed: Jun. 14, 2018

(65) Prior Publication Data
US 2019/0058012 A1 Feb. 21, 2019

(30) Foreign Application Priority Data
Aug. 18, 2017 (CN) .......................... 2017 1 0712892

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3253* (2013.01); *H01L 27/3279* (2013.01); *H01L 51/525* (2013.01); *H01L 51/5228* (2013.01); *H01L 51/5234* (2013.01); *H01L 51/5284* (2013.01); *H01L 51/56* (2013.01)

(58) Field of Classification Search
CPC ... H01L 27/322; H01L 51/56; H01L 51/5284; H01L 27/3253; H01L 27/3279; H01L 51/5228; H01L 51/525; H01L 51/5234; H01L 51/5253; H01L 51/5259; H01L 51/5258; H01L 27/1214; H01L 27/1274; H01L 27/1288
See application file for complete search history.

(56) References Cited

U.S. PATENT DOCUMENTS 7,402,467 B1 * 7/2008 Kadono ............. H01L 27/1214
438/151

* cited by examiner

Primary Examiner — Jasmine J Clark
(74) Attorney, Agent, or Firm — Collard & Roe, P.C.

(57) ABSTRACT

An OLED display panel includes a cover and a backplane, a plurality of color filter (CF) units are arranged in an array on the cover; auxiliary cathodes are filled into gaps among the CF units; the auxiliary cathodes include a black matrix, a buffer layer and a metal layer; a planarization layer is disposed on the auxiliary cathodes and the CF units; a plurality of openings are disposed in the planarization layer at locations corresponding to the auxiliary cathodes; a plurality of spacers are disposed on the planarization layer at locations corresponding to the auxiliary cathodes; the spacers abut against and support the cover and the backplane; a transparent electrode layer is disposed on the planarization layer and the spacers and is communicated with the auxiliary cathodes via the openings; and the plurality of CF units of the cover and pixel regions of the backplane are oppositely arranged.

15 Claims, 3 Drawing Sheets

OLED DISPLAY PANEL, MANUFACTURING METHOD THEREOF AND DISPLAY DEVICE

CROSS REFERENCE TO RELATED APPLICATIONS

Applicant claims priority under 35 U.S.C. § 119 of Chinese Application No. 201710712892.1 filed on Aug. 18, 2017, the disclosure of which is incorporated by reference.

TECHNICAL FIELD

Embodiments of the present disclosure relates to an organic light-emitting diode (OLED) display panel, a manufacturing method thereof and a display device.

BACKGROUND

The OLED display panel has been taken as the next-generation display technology with extreme development prospect due to the advantages of thinness, lightness, wide viewing angle, active emission, continuous and adjustable luminous colors, low cost, rapid response speed, low energy consumption, low driving voltage, wide working temperature range, simple manufacturing process, high luminous efficiency, flexible display, etc.

SUMMARY

An embodiment of the present disclosure provides an organic light-emitting diode (OLED) display panel, comprising a cover and a backplane which are cell-assembled, a plurality of color filter (CF) units, auxiliary cathodes, a planarization layer, a plurality of spacers and a transparent electrode layer, wherein the plurality of color filter (CF) units are arranged in an array on the cover; the auxiliary cathodes are filled into gaps among the CF units; the auxiliary cathodes comprise a black matrix (BM), a buffer layer and a metal layer which are sequentially disposed on the cover; the planarization layer is disposed on the auxiliary cathodes and the CF units; a plurality of openings are disposed in the planarization layer at locations corresponding to the auxiliary cathodes; the plurality of spacers are disposed on the planarization layer at the locations corresponding to the auxiliary cathodes, and abut against and support the cover and the backplane; the transparent electrode layer is disposed on the planarization layer and the spacers and is electrically communicated with the auxiliary cathodes via at least a part of the openings; and the plurality of color filter (CF) units of the cover are oppositely arranged to pixel regions of the backplane.

In an embodiment of the present disclosure, for example, orthographic projections of the plurality of openings on the cover do not overlap with orthographic projections of the plurality of spacers on the cover.

In an embodiment of the present disclosure, for example, each of the spacers has a shape of a circular truncated cone; and an orthographic projection of each of the spacers on the cover falls within an orthographic projection of each of the auxiliary cathodes on the cover.

In an embodiment of the present disclosure, for example, a material of the transparent electrode layer comprises indium tin oxide (ITO), aluminum doped zinc oxide (AZO), indium doped zinc oxide (IZO), fluorine doped tin oxide (FTO) or aluminum doped zinc tin oxide (AZTO).

In an embodiment of the present disclosure, for example, a material of the metal layer of the auxiliary cathodes comprises silver, copper, aluminum or molybdenum.

In an embodiment of the present disclosure, for example, the cover and the backplane are subjected to a process of pressing encapsulation.

An embodiment of the present disclosure provides a display device, comprising the above described OLED display panel.

An embodiment of the present disclosure provides method for manufacturing an OLED display panel, comprising: forming a black matrix (BM), a buffer layer and a metal layer on a cover in sequence; forming an auxiliary cathode by partially removing the BM, the buffer layer and the metal layer through a patterning process; forming a plurality of color filter (CF) units at an area outside the auxiliary cathode; forming a planarization layer on the auxiliary cathode and the plurality of color filter (CF) units, and forming a plurality of openings in the planarization layer at locations corresponding to the auxiliary cathode; forming a plurality of spacers on the planarization layer at locations corresponding to the auxiliary cathode; forming a transparent electrode layer on the spacers and the planarization layer; and forming the OLED display panel through cell-assembling and encapsulating of the cover and a backplane.

In an embodiment of the present disclosure, for example, the method further comprising: oppositely arranging the plurality of color filter (CF) units of the cover and pixel regions of the backplane.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one.

In order to manufacture high-resolution displays and obtain high-definition and high-fidelity display images, the industry provides a proposal of combining Oxide BP and Printing OLED to realize top emission. The inventors of the present invention have noted that: top emission requires production of transparent cathodes; and for instance, as materials such as evaporated magnesium, silver or transparent conductive oxide indium zinc oxide (IZO) have large resistance, common electrodes have the disadvantage of voltage drop, so auxiliary cathode wirings are required to be designed. Auxiliary cathodes are manufactured on a backplane, which not only is difficult to be realized in process but also has the risk of short circuit for wirings, so the yield cannot be guaranteed.

Figure 1:
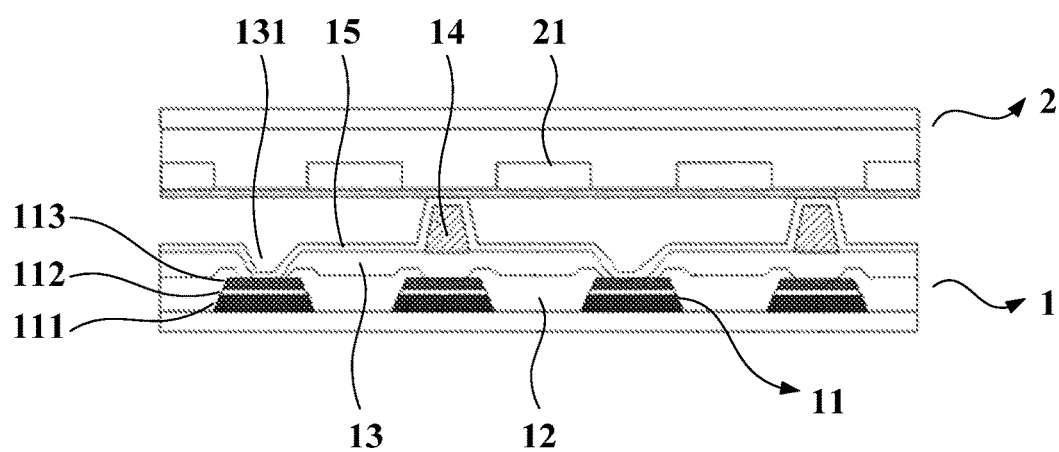
FIG. 1 is a schematic structural sectional view of an OLED display panel provided by an embodiment of the present invention.

As illustrated in FIG. 1, the OLED display panel provided by the present embodiment of the invention comprises a cover 1 and a backplane 2 which are cell-assembled (i.e., assembled together to form a cell).

A plurality of color filter (CF) units 12 are arranged in an array on the cover 1; auxiliary cathodes 11 are filled into gaps among the CF units 12; the auxiliary cathodes 11 include a black matrix (BM) 111, a buffer layer 112 and a metal layer 113 which are sequentially formed on the cover 1.

A planarization layer 13 is formed on the auxiliary cathodes 11 and the CF units 12; a plurality of openings 131 are formed in the planarization layer 13 at locations corresponding to the auxiliary cathodes 11;

A plurality of spacers 14 are formed in the planarization layer 13 at locations corresponding to the auxiliary cathodes 11; the plurality of spacers 14 abut against and support the cover 1 and the backplane 2.

A transparent electrode layer 15 is formed on the planarization layer 13 and the spacers 14 and communicated with the auxiliary cathodes 11 via at least a part of the openings 131.

The plurality of color filter (CF) units 12 of the cover 1 and pixel regions 21 of the backplane 2 are oppositely arranged.

In the embodiments of the present invention, considering that metal has higher adhesion on an insulating medium and does not fall off easily and the yield can be improved, metal layers of the auxiliary cathodes 11 are deposited on the buffer layer 112; and due to the structure of the plurality of color filter (CF) units 12, the planarization layer 13 and the transparent electrode layer 15 on the periphery of the auxiliary cathodes, the shading rate is reduced and the display efficiency of the OLED display panel is improved. In addition, in the OLED display panel provided by the embodiments of the present invention, the openings are formed on the planarization layer 13 and the transparent conductive layer is connected with wirings of the metal layers via the openings, the contact area between the transparent conductive layer and the metal layers is increased; the parasitic resistance is reduced; and finally the voltage drop is reduced.

In an embodiment of the present invention, projections of the plurality of openings of the planarization layer 13 on the cover 1 do not overlap with projections of the plurality of spacers 14 (which are formed on the planarization layer 13) on the cover 1. In the OLED display panel, the conductivity of the display panel gets better as the number of the openings gets larger. In actual production, the openings may be uniformly and dispersedly arranged as required, and the spacers, functioning as supporting structures of the display panel, are also uniformly and dispersedly arranged. In a same pixel, it is practical that both the opening and the spacer are provided, or one of the opening and the spacer is provided, or both the opening and the spacer are not provided. But in the case that both the opening and the spacer are provided in a same pixel (projection coincidence), the opening does not have conductivity, and only the supporting function of the spacer is provided.

For example, the spacer 14 in the OLED display panel provided by an embodiment of the present invention has a shape of a circular truncated cone, and an orthographic projection of the spacer 14 on the cover 1 falls within an orthographic projection of the auxiliary cathode 11 on the cover 1. Because interval areas among adjacent CF units are all auxiliary cathodes 11, and the auxiliary cathodes 11, in which the black matrix is integrated, also has light shielding performance, the arrangement of the spacers 14 between adjacent CF units 12 (namely the auxiliary cathode 11 areas) can reduce the impact of the spacers 14 on the light transmittance and improve the display efficiency of the OLED display panel. The spacers 14 are disposed between the cover 1 and the backplane 2 and configured to support and isolate the cover 1 and the backplane 2 and provide friction force to prevent misalignment between the cover 1 and the backplane 2. The spacer 14 can be easily restored after being horizontally misaligned under the action of external force, and can rapidly restore the function of supporting two substrates, and as a result, uneven display of the two substrates due to horizontal misalignment and light leakage can be eliminated. The spacers for example, may adopt black post spacers, and hence can further reduce the impact of the spacers on the light transmittance and improve the display efficiency of the OLED display panel.

In the embodiments of the present invention, a material of the cover and the backplane is not specifically limited and can be determined by manufacturers according to the factors such as demand and price. As glass is easy to obtain and is affordable, and has good light transmittance, glass may be employed as a material for the cover and the backplane.

In the embodiments of the present invention, the materials of the transparent electrode layer and the metal layer of the auxiliary cathode are also not limited; the material of the transparent electrode layer includes ITO, AZO, IZO, FTO or AZTO and may be selected as required; and the material of the metal layer of the auxiliary cathode includes silver, copper, aluminum, molybdenum or the like or alloy of the above metals.

The material of transparent cathodes on the transparent electrode layer of the backplane in the embodiments of the present invention includes but not limited to transparent conductive oxide such as Aluminum doped Zinc Oxide (AZO) and Indium doped Zinc Oxide (IZO) and thin metallic materials such as magnesium and silver, which are cooperated with microcavity structures to realize the production of top emission electrodes. The materials of the planarization layer in the embodiments of the present invention comprise organic insulating dielectric materials (OC) and include but are not limited to organic materials such as polysiloxane materials, acrylic materials or polyimide materials. The materials of the buffer layer taken as a TFT dielectric layer and a capacitive dielectric layer, injection laser diodes (ILD) and an organic environment-friendly insulating plastic (PVX) layer include but are not limited to silicon oxide ($SiO_x$), silicon nitride ($SiN_x$) and silicon oxynitride (SiON), or various novel organic insulating materials, or barium-based materials (High k materials) such as aluminum oxide ($AlO_x$) and barium oxide.

The embodiments of the present invention do not specifically limit the deposition process of forming the metallic materials, the materials of the planarization layer or the plurality of color filter (CF) units.

In the embodiments of the present invention, the cover and the backplane are subjected to pressing package. For example, add one layer of cover glass, deposit the plurality of color filter (CF) units and the auxiliary cathodes on the cover glass, and press the cover and backplane glass. Meanwhile, sealant may also be adopted for the pressing package of the backplane and the cover, which can ensure the sealability of the display, and eliminate the impact of water and oxygen on the performances of the device.

The embodiments of the present invention further provide a display device, which comprises the OLED display panel provided by any foregoing technical solution. As the OLED display panel has the above beneficial effects, the structure of the display device also greatly simplifies the manufacturing process, improves the yield, and improves the production efficiency of products and the product quality.

Figure 2:
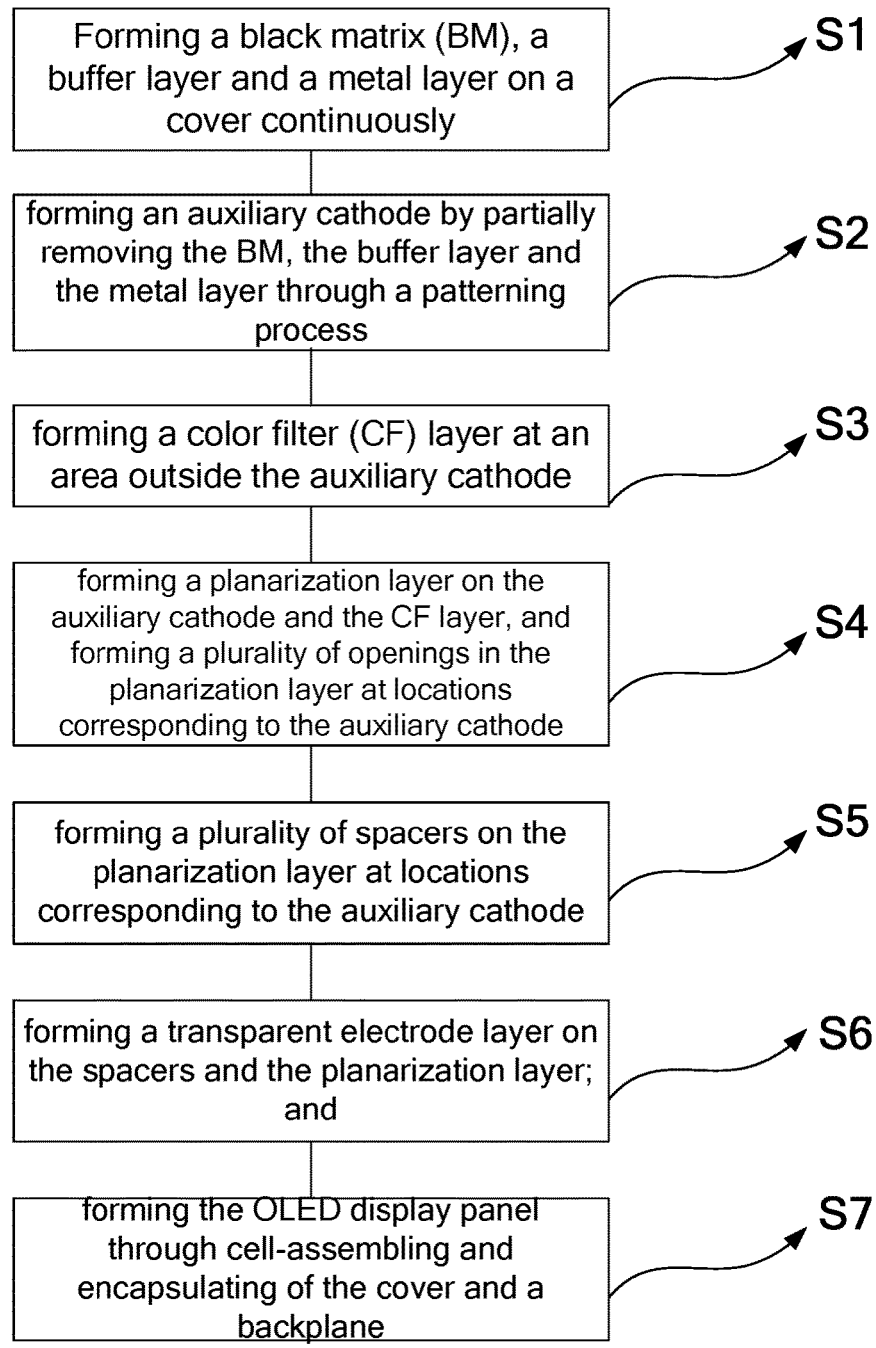
FIG. 2 is a flow chart of a method for manufacturing an OLED display panel provided by an embodiment of the present invention.
Figure 3:
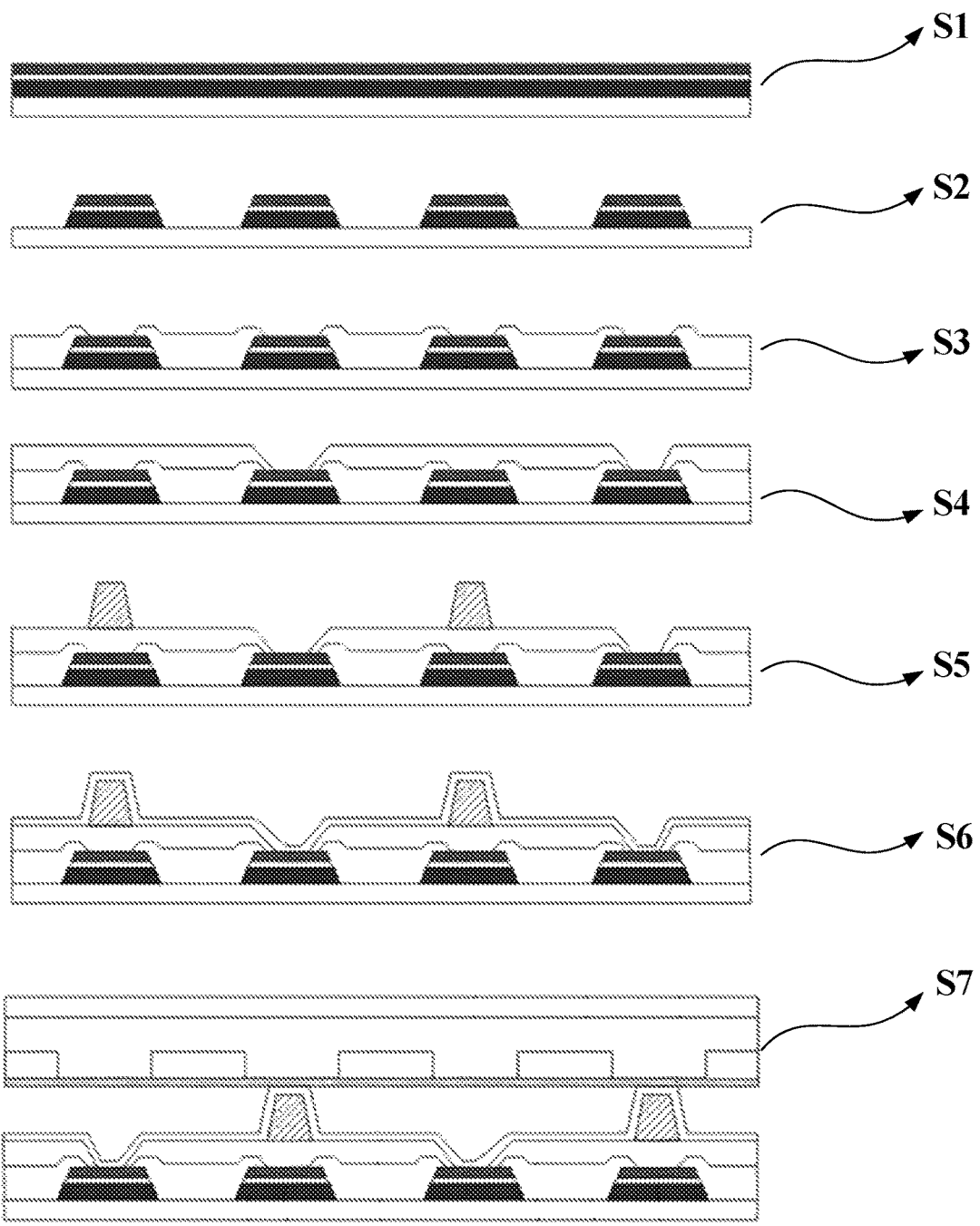
FIG. 3 is a flow chart of a method for manufacturing an OLED display panel provided by one preferred embodiment of the present invention.

In addition, the embodiments of the present invention further provide a method for manufacturing an OLED display panel, which, as shown in FIGS. 2 and 3, comprises:

S1: forming black matrixes (BMs), buffer layers and metal layers on a cover continuously;

S2: forming auxiliary cathodes by partially removing the BMs, the buffer layers and the metal layers by patterning processes;

S3: forming a plurality of color filter (CF) units at areas outside the auxiliary cathodes;

S4: forming a planarization layer on the auxiliary cathodes and the plurality of color filter (CF) units, and forming a plurality of openings at locations corresponding to the auxiliary cathodes;

S5: forming a plurality of spacers on the planarization layer at locations corresponding to the auxiliary cathodes;

S6: forming a transparent electrode layer on the spacers and the planarization layer; and S7: forming the OLED display panel by cell-assembling and encapsulation of the cover and a backplane.

For example, the method may further comprise: oppositely arranging the plurality of color filter (CF) units of the cover and pixel regions of the backplane.

As the method is adopted for manufacturing the OLED display panel, the manufacturing process is simplified; as the metal layer of the auxiliary cathode is deposited on the buffer layer, and metal has higher adhesion on an insulating medium and does not fall off easily, the yield can be improved. As the BMs, the buffer layers and the metal layers are formed through one patterning process, masks can be omitted, and the patterning process is simplified. With the structures of the plurality of color filter (CF) units, the planarization layer and the transparent electrode layer on the periphery of the auxiliary cathodes, the light shading rate is reduced, and hence the production efficiency and the product quality of the OLED display panel provided by the embodiments of the present invention can be improved.

As illustrated in FIG. 3, in an embodiment of the present invention, the method for manufacturing the OLED display panel comprises the following steps:

S1: selecting clean glass cover, and continuously depositing the BMs, the buffer layers and the metal layers on the glass cover, in which the material of the metal layer includes but is not limited to Ag, Cu, Al and Mo or a compound of the above metals, or an alloy of the above materials;

S2: forming auxiliary cathode wiring patterns and light shielding patterns with BM/buffer layer/metal layer structure by performing coating and photolithography on the metal layers and subsequently executing continuous etching;

S3: forming Red (R) Green (G) and Blue (B) color filter (CF) patterns in sequence, and allowing the edges of color filters to cover the metal layers of the light shielding auxiliary cathodes;

S4: coating a planarization layer, and forming openings on the planarization layer on the auxiliary cathode patterns by photolithography;

S5: depositing spacer materials and forming patterns, and arranging the spacer patterns over the metal patterns of the auxiliary cathodes, in which the width of the patterns is slightly less than a width of the metal patterns of the auxiliary cathodes;

S6: forming a transparent electrode layer by depositing transparent conductive oxide materials, in which the material of the transparent electrode layer is connected with wirings of the metal layers of the auxiliary cathodes via the openings on the planarization layer, so as to finish the production of the cover; and S7: forming the top emission OLED display panel by pressing and encapsulating the glass cover and top emission glass backplane, in which the plurality of color filter (CF) units on the cover correspond to pixel regions on the backplane.

It should be noted that: in the process of manufacturing the OLED display panel, the technical solution of the embodiments of the present invention is applicable to process flows based on TFTs with different structures; the TFTs adopt various oxides, silicon materials and organic matter materials as an active agent; the material of the active agent includes amorphous indium gallium zinc oxide (a-IGZO), zinc oxynitride, indium zinc tin oxide (IZTO), amorphous silicon (a-Si), polysilicon (p-Si), hexathiophene, polythiophene or other materials; and that is to say, the proposal is simultaneously applicable to backplanes manufactured on the basis of oxygen technology, silicon technology and organic matter technology, and cannot affect the final production of the OLED display panel.

The present application claims the priority of the Chinese Patent Application No. 201710712892.1 filed on Aug. 18, 2017, which is incorporated herein by reference as part of the disclosure of the present application.

What is claimed is:

1. An organic light-emitting diode (OLED) display panel, comprising a cover and a backplane which are cell-assembled, a plurality of color filter (CF) units, auxiliary cathodes, a planarization layer, a plurality of spacers and a transparent electrode layer, wherein
the plurality of color filter (CF) units are arranged in an array on the cover; the auxiliary cathodes are filled into gaps among the CF units; the auxiliary cathodes comprise a black matrix (BM), a buffer layer and a metal layer which are sequentially disposed on the cover;
the planarization layer is disposed on the auxiliary cathodes and the CF units; a plurality of openings are disposed in the planarization layer at locations corresponding to the auxiliary cathodes;
the plurality of spacers are disposed on the planarization layer at the locations corresponding to the auxiliary cathodes, and abut against and support the cover and the backplane;
the transparent electrode layer is disposed on the planarization layer and the spacers and is electrically communicated with the auxiliary cathodes via at least a part of the openings; and the plurality of color filter (CF) units of the cover are oppositely arranged to pixel regions of the backplane.

2. The OLED display panel according to claim 1, wherein orthographic projections of the plurality of openings on the cover do not overlap with orthographic projections of the plurality of spacers on the cover.

3. The OLED display panel according to claim 1, wherein each of the spacers has a shape of a circular truncated cone; and an orthographic projection of each of the spacers on the cover falls within an orthographic projection of each of the auxiliary cathodes on the cover.

4. The OLED display panel according to claim 1, wherein a material of the transparent electrode layer comprises indium tin oxide (ITO), aluminum doped zinc oxide (AZO), indium doped zinc oxide (IZO), fluorine doped tin oxide (FTO) or aluminum doped zinc tin oxide (AZTO).

5. The OLED display panel according to claim 1, wherein a material of the metal layer of the auxiliary cathodes comprises silver, copper, aluminum or molybdenum.

6. The OLED display panel according to claim 1, wherein the cover and the backplane are subjected to a process of pressing encapsulation.

7. A display device, comprising the OLED display panel according to claim 1.

8. A method for manufacturing an OLED display panel, comprising:

forming a black matrix (BM), a buffer layer and a metal layer on a cover in sequence;

forming an auxiliary cathode by partially removing the BM, the buffer layer and the metal layer through a patterning process;

forming a plurality of color filter (CF) units at an area outside the auxiliary cathode;

forming a planarization layer on the auxiliary cathode and the plurality of color filter (CF) units, and forming a plurality of openings in the planarization layer at locations corresponding to the auxiliary cathode;

forming a plurality of spacers on the planarization layer at locations corresponding to the auxiliary cathode;

forming a transparent electrode layer on the spacers and the planarization layer; and forming the OLED display panel through cell-assembling and encapsulating of the cover and a backplane.

9. The method for manufacturing the OLED display panel according to claim 8, further comprising: oppositely arranging the plurality of color filter (CF) units of the cover and pixel regions of the backplane.

10. The OLED display panel according to claim 2, wherein each of the spacers has a shape of a circular truncated cone; and an orthographic projection of each of the spacers on the cover falls within an orthographic projection of each of the auxiliary cathodes on the cover.

11. The OLED display panel according to claim 2, wherein a material of the transparent electrode layer comprises indium tin oxide (ITO), aluminum doped zinc oxide (AZO), indium doped zinc oxide (IZO), fluorine doped tin oxide (FTO) or aluminum doped zinc tin oxide (AZTO).

12. The OLED display panel according to claim 3, wherein a material of the transparent electrode layer comprises indium tin oxide (ITO), aluminum doped zinc oxide (AZO), indium doped zinc oxide (IZO), fluorine doped tin oxide (FTO) or aluminum doped zinc tin oxide (AZTO).

13. The OLED display panel according to claim 2, wherein a material of the metal layer of the auxiliary cathodes comprises silver, copper, aluminum or molybdenum.

14. The OLED display panel according to claim 3, wherein a material of the metal layer of the auxiliary cathodes comprises silver, copper, aluminum or molybdenum.

15. The OLED display panel according to claim 4, wherein a material of the metal layer of the auxiliary cathodes comprises silver, copper, aluminum or molybdenum.

* * * * *